United States Patent
Kubota

(10) Patent No.: US 9,263,077 B2
(45) Date of Patent: Feb. 16, 2016

(54) THERMAL RETENTION STRUCTURE FOR A DATA DEVICE

(76) Inventor: Yukiko Kubota, Campbell, CA (US)

( * ) Notice: Subject to any disclaimer, the term of this patent is extended or adjusted under 35 U.S.C. 154(b) by 310 days.

(21) Appl. No.: 13/442,526

(22) Filed: Apr. 9, 2012

(65) Prior Publication Data
US 2013/0266740 A1 Oct. 10, 2013

(51) Int. Cl.
G11B 5/66 (2006.01)
G11B 5/84 (2006.01)
G11B 5/64 (2006.01)
G11B 5/73 (2006.01)

(52) U.S. Cl.
CPC .. *G11B 5/84* (2013.01); *G11B 5/64* (2013.01); *G11B 5/7325* (2013.01)

(58) Field of Classification Search
None
See application file for complete search history.

(56) References Cited

U.S. PATENT DOCUMENTS

| | | | |
|---|---|---|---|
| 6,183,606 B1 | 2/2001 | Kuo et al. | |
| 6,727,010 B2 | 4/2004 | Hanawa et al. | |
| 7,006,328 B2 | 2/2006 | Osawa | |
| 7,521,135 B2 * | 4/2009 | Morikawa et al. | 428/824.1 |
| 7,879,468 B2 | 2/2011 | Uchida | |
| 8,034,413 B2 | 10/2011 | Uchida | |
| 2005/0213436 A1 * | 9/2005 | Ono et al. | 369/13.02 |
| 2007/0026263 A1 * | 2/2007 | Kubota et al. | 428/832 |
| 2009/0123781 A1 | 5/2009 | Uchida | |
| 2009/0148723 A1 * | 6/2009 | Tsuda | 428/846.3 |
| 2009/0246362 A1 * | 10/2009 | Kuo et al. | 427/127 |
| 2010/0108496 A1 * | 5/2010 | Abarra | 204/192.15 |
| 2010/0123967 A1 * | 5/2010 | Batra et al. | 360/59 |
| 2012/0070784 A1 * | 3/2012 | Balamane et al. | 430/296 |
| 2014/0043947 A1 * | 2/2014 | Hohlfeld et al. | 369/13.4 |

* cited by examiner

*Primary Examiner* — Holly Rickman
(74) *Attorney, Agent, or Firm* — Hall Estill Attorneys at Law

(57) ABSTRACT

A data device may have at least a magnetic lamination with a thermal retention structure deposited on a substrate and configured to maintain a predetermined temperature for a predetermined amount of time. Such predetermined temperature and amount of time may allow for the growth of a magnetic layer with a predetermined magnetic anisotropy.

5 Claims, 4 Drawing Sheets

FIG. 5
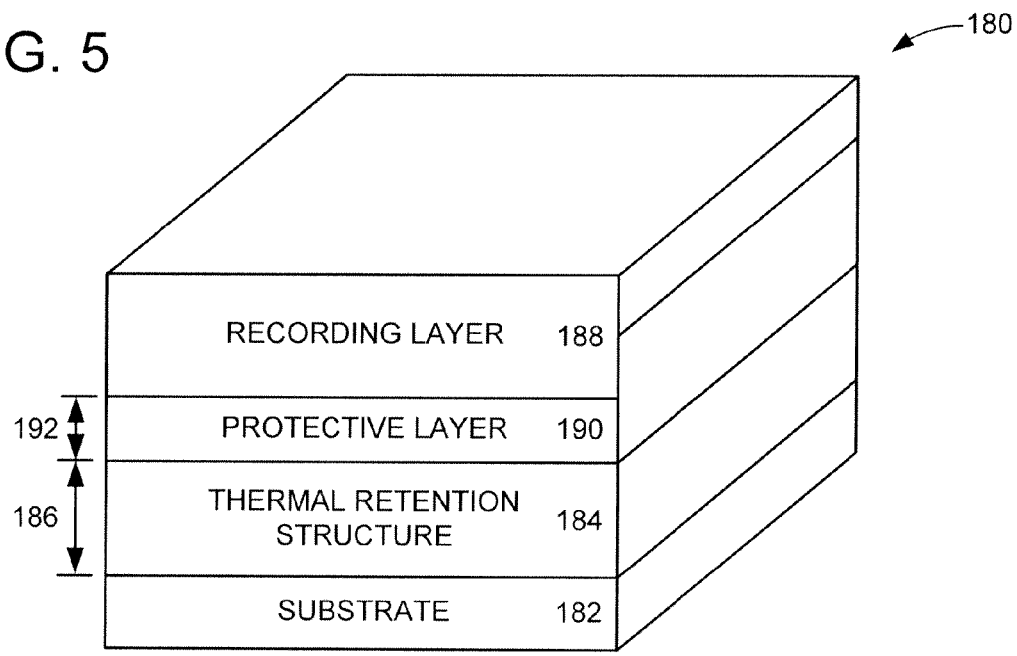
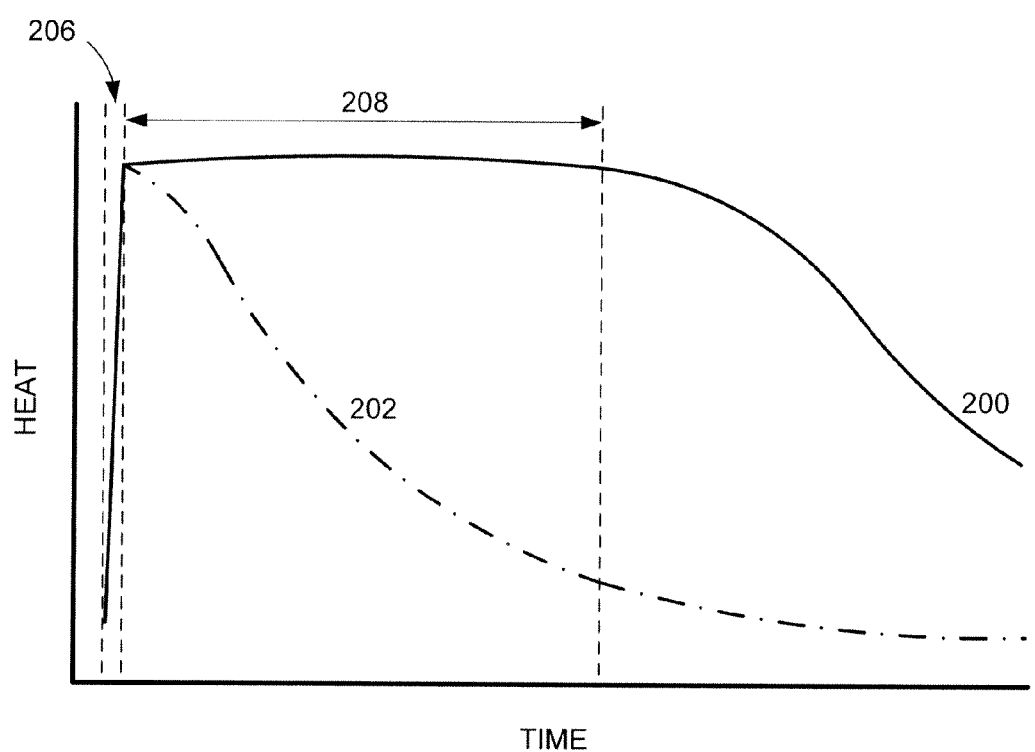
FIG. 6

THERMAL RETENTION STRUCTURE FOR A DATA DEVICE

SUMMARY

Various embodiments are generally directed to a data device. According to some embodiments, a magnetic lamination can have at least a thermal retention structure deposited on a substrate and configured to maintain a predetermined temperature for a predetermined amount of time, which may allow for the growth of a magnetic layer with a predetermined magnetic anisotropy.

BRIEF DESCRIPTION OF THE DRAWINGS

FIG. 5 provides a block representation of a cross-section of an example data storage media capable of being used in the device of FIG. 1.

FIG. 6 graphs structural data corresponding with various embodiments of an example magnetic lamination.

DETAILED DESCRIPTION

The present disclosure generally provides various embodiments of a magnetic lamination configured to retain heat for a predetermined amount of time. As the data storage industry progresses to increased data capacity and faster data access, magnetic laminations are becoming a choke point for advancing data storage and retrieval. That is, while several technologies are being advanced to increase the ability to write data faster, such as heat assisted magnetic recording (HAMR), the magnetic capabilities of a recording lamination can limit how small and close magnetic data bits can be placed with accurate data access. As such, there is continued industry demand for magnetic laminations that can handle increased data bit density while allowing reliable data accesses, especially in reduced form factor data storage devices.

Accordingly, a data storage media can be configured with at least a thermal retention structure that is tuned with respect to a substrate to maintain a predetermined temperature for a predetermined amount of time, which may allow the growth of a magnetic layer with a predetermined magnetic anisotropy. The retention of a particular amount of heat for a particular length of time can allow for creation of high in-plane anisotropic magnetic layers at a rate that allows for commercial practicality. In other words, heat may be applied in-situ to achieve temperatures for a given amount of time, but such activity is detrimental to commercially producing numerous data storage media, such as 1000 media per hour.

With the inclusion of at least a thermal retention structure to a data storage media, the media can be tuned with respect to the underlying substrate so that heat that is applied once, and for a short period of time, can be retained and allow crystalline recording layer fabrication without continued application of heat from an external source.

Figure 1:
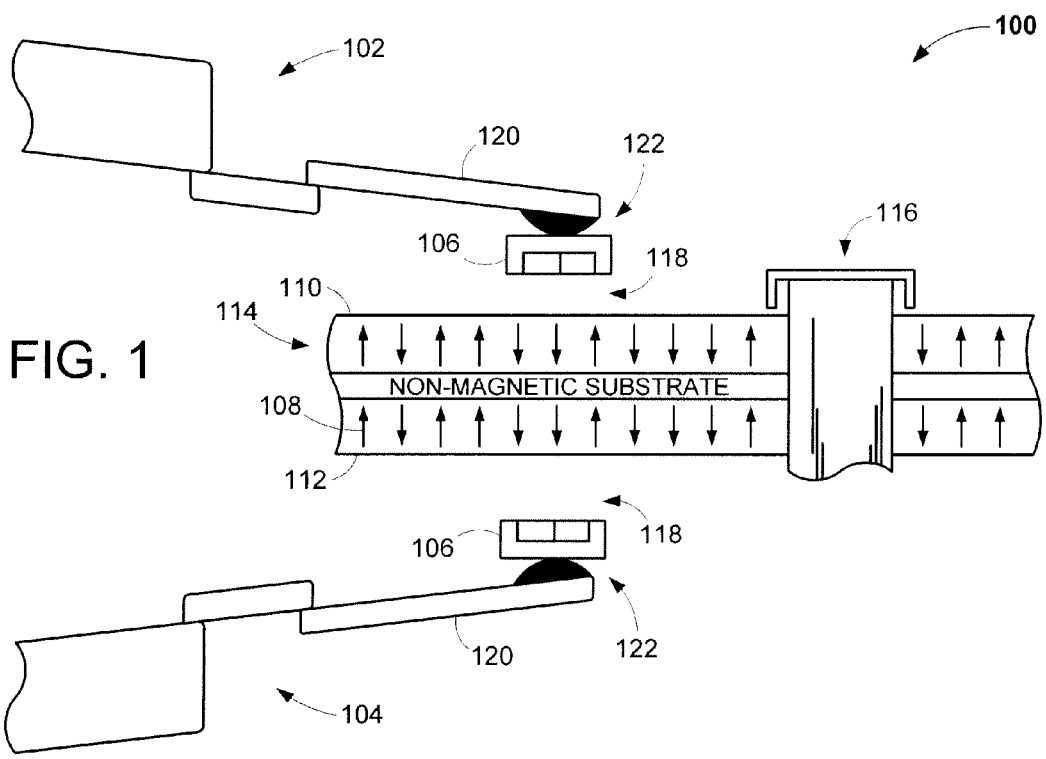
FIG. 1 provides an exploded view of an exemplary data storage device.

FIG. 1 generally illustrates an example data transducing portion 100 of a data storage device. The transducing portion 100 is shown in an environment in which various embodiments of a data storage media can be practiced. It will be understood, however, that the various embodiments of this disclosure are not so limited by the environment displayed in FIG. 1 and can be implemented in a variety of different data storage devices.

The transducing portion 100 has first and second actuating assemblies 102 and 104 each configured with a transducing head 106 positioned over programmed data bits 108 present on opposite surfaces 110 and 112 of a single magnetic storage media 114. The storage media 114 is attached to a spindle motor 116 that rotates during use to produce an air bearing surface (ABS) 118 on which a slider portion 120 of each actuating assembly 102 and 104 flies to position a head gimbal assembly (HGA) 122, which includes the transducing heads 106, over a desired portion of the media 114.

The transducing heads 106 can include one or more transducing elements, such as a magnetic writer and magnetically responsive reader, which operate to program and read data from the surfaces 110 and 112 of the storage media 114, respectively. In this way, controlled motion of the actuating assemblies 102 and 104 may induce the transducers 106 to align with data tracks (not shown) defined on the storage media surfaces 110 and 112 to write, read, and rewrite data.

Figure 2:
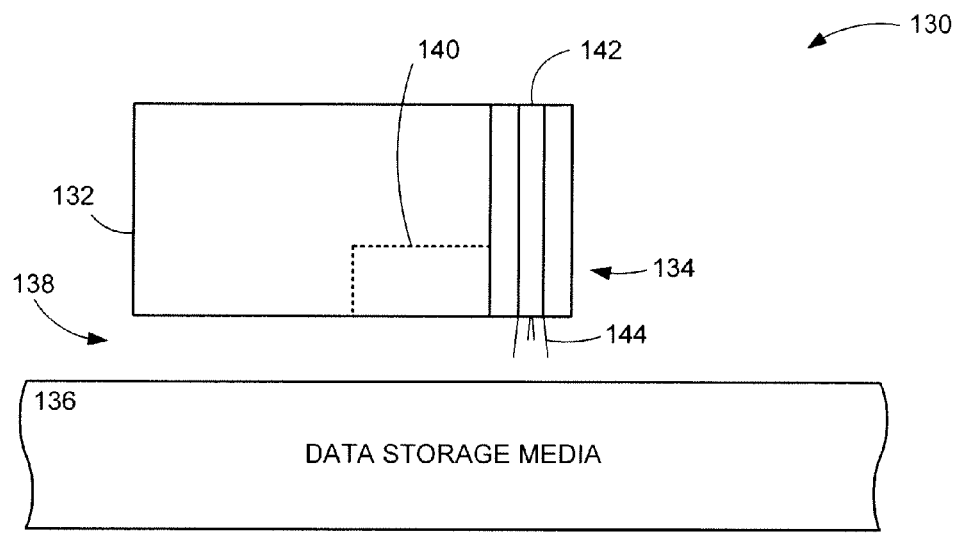
FIG. 2 shows a block representation of selected portions of a data storage device.

FIG. 2 provides a block representation of portions of an example data transducing assembly 130 that can be used in the data storage device 100 of FIG. 1. The data transducing assembly 130 may be configured with at least a transducing head 132 attached to a heating element 134, such as a laser, to heat an adjacent data storage media 136 across an air bearing 138. The transducing head 132 may have one or more data access elements 140 that allow data to be programmed and read from the data storage media.

The air bearing 138 can be passively and actively modulated to position the data access elements 140 a predetermined height above one or more data bit locations as the data storage media 136 rotates. While not required to program or read data, the heating element 134 can be configured to temporarily modifying the magnetic coercivity of selected regions of the data storage media 136 with an optical emitter 142 adapted to discharge optical energy 144 to allow more efficient data access with the data access elements 140.

With or without the use of the heating element 134, the data storage media 136 can be configured with an elevated magnetic coercivity and anisotropy, especially in-plane anisotropy, that allows data bits to be compressed into a smaller area, thus increasing data capacity. However, fabrication of data storage media with such elevated coercivity and anisotropy can correspond with the maintenance of high substrate temperatures, such as 400-800° C., which can be challenging to sustain while maintaining commercially viable media fabrication throughput.

Figure 3:
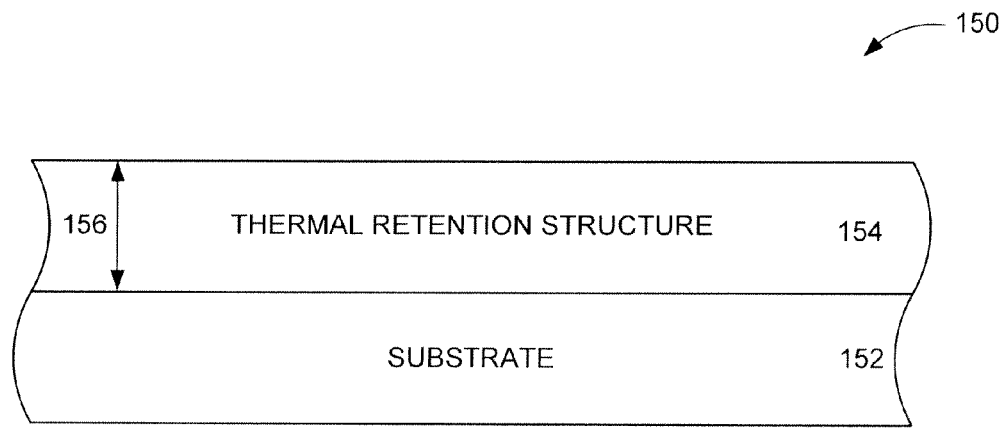
FIG. 3 display a block representation of a cross-section of an example magnetic lamination constructed in accordance with various embodiments.

FIG. 3 provides a block representation of a portion of an example data storage media 150 that is capable of being tuned to sustain high substrate temperatures without continuous application of external heat during fabrication. While a magnetic recording lamination can be constructed in variety of different, non-limiting manners, the data storage media 150 is formed on a substrate 152. The substrate 152 may provide structural properties, like surface roughness and heat conductance, that contribute to the growth and deposition of layers, such as the thermal retention structure 154.

It should be noted that the any number of intervening layers, like a seed layer, may be disposed between the substrate 152 and thermal retention structure 154 to promote the formation of various structural and magnetic characteristics, but no such intervening layers are required or limited by the present disclosure. In various embodiments, the substrate 152 is comprised of materials with low thermal conductance, such as glass and glass ceramic composites, while other embodiments use materials with large thermal conductance, such as Si, AlMg, and NiP.

While the choice of substrate material may be in response to a host of different reasons, like mechanical integrity and cost, the formation of the thermal retention structure 154 is tuned to compensate for the chosen substrate 152 material to provide predetermined structural and operational characteristics, such as heat conductance and the subsequent growth of crystalline magnetic layers. For example, if a glass or glass composite is used for the substrate 152, which has a low thermal conductance, the thermal retention structure 154 can be a continuous magnetic film, such as Cu and Mo, that provides emissivity that allows the substrate 152 to retain predetermined amounts of thermal energy for predetermined lengths of time.

The consideration of the material and structural characteristics of the substrate 152 provides the ability to tune the thickness 156, material, and emissivity of the thermal retention structure 154 so that heat applied to the data storage media 150 in a single application is retained at a predetermined temperature, such as 400-800° C., for a predetermined amount of time, such as 3 ps-60 s, without the continued application of heat in-situ to the substrate 152.

Figure 4:
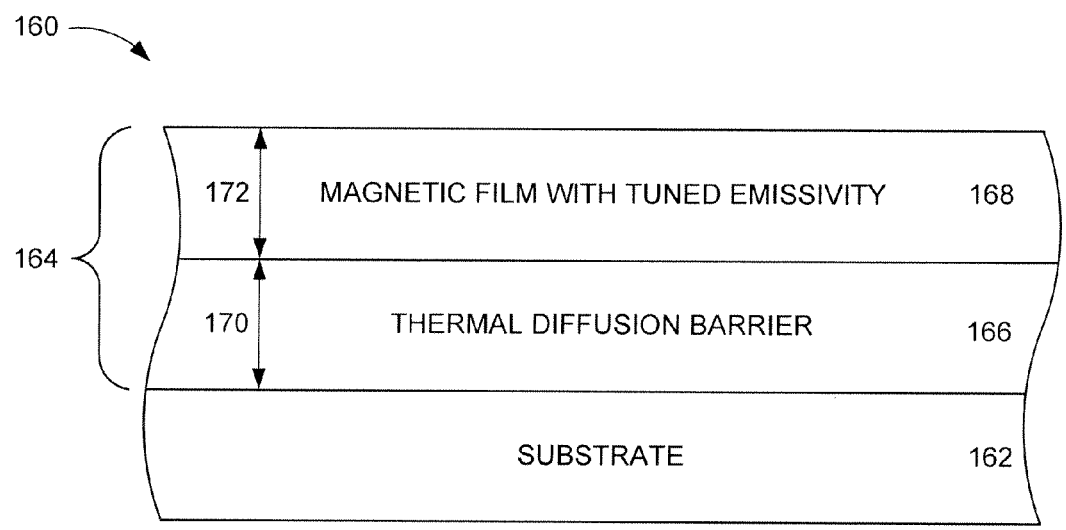
FIG. 4 illustrates a block representation of a cross-section of an example magnetic lamination constructed in accordance with various embodiments.

FIG. 4 displays a block representation of a cross-section of another example data storage media 160 capable of being tuned to provide predetermined heat retention. The use of a substrate 162 material with high thermal conductance, such as Si and AlMg, can be accommodated by tuning the thermal retention structure 164 as a lamination of a thermal diffusion barrier 166 and a magnetic film with tuned emissivity. The construction of the thermal diffusion barrier 166, which can be an unlimited variety of materials that provide thermal diffusion, such as SiN and $SiO_2$, between the magnetic film 168 and the substrate 162 can allow the metallic film 168 to emit thermal energy without the substrate 162 dissipating the heat too quickly due to elevated conductance.

As shown in FIGS. 3 and 4, the ability to tune the thermal retention structure 154 and 164 with respect to the substrate 152 and 162 can allow for the fabrication of magnetic recording layers that are conducive to high data bit density. That is, the tuned configuration of the thermal retention structure 154 and 164 with thicknesses 156, 170 and 172 and materials that complement the substrate 152 and 162 allows heat to be retained so that recording layers, such as high in-plane anisotropy (Ku) $L_{10}$-FePt and crystalline RE-Co alloys, can be fabricated.

It should be noted that high in-plane anisotropic materials commonly correspond to elevated substrate temperatures for proper growth, which is challenging with substrate materials that either conduct and dissipate heat, such as Si, or fail to conduct enough heat to maintain elevated temperatures over time, such as glass.

FIG. 5 generally illustrates a block representation of a portion of a data storage media 180 constructed in accordance with various embodiments. While the data storage media 180 can permanently include a substrate 182, some embodiments remove the substrate 182 subsequent to formation of the media 180 in its entirety. Regardless of whether the substrate 182 is removed or not, a thermal retention structure 184, which may be similar or dissimilar from the structures 154 and 164 of FIGS. 3 and 4, is tuned with a thickness 186 and configuration with respect to the substrate 182 and deposited thereon.

The formation of the thermal retention structure 184 may allow the deposition and growth of a magnetic recording layer 188. The construction of the recording layer 188 is not limited, but in some embodiments can be configured for perpendicular data recording with discrete data tracks and servo information. The recording layer 188 may further be configured as a lamination of multiple layers without limitation, such as a soft magnetic underlayer and interlayer(s), that may or may not be deposited and grown while the substrate 182 is maintained at the predetermined elevated temperature.

While not required, the data storage media 180 may be formed with a protective layer 190 disposed between the recording layer 188 and thermal retention structure 184 and constructed of a material, such as SiN and $SiO_2$, that has a thermal conductivity that allows data bit access in a variety of manners, like HAMR and perpendicular recording. The thicknesses of the various layers of the data storage media 180 can also be tuned in response to the substrate 182 as well as the eventual manner of data bit access. For example, the thermal retention structure thickness 186 can range from 30-200 nm and the protection layer thickness 192 can be between 1-20 nm.

FIG. 6 graphs example structural data 200 and 202 of a data storage media, specifically, the amount of heat retained by a substrate over time when a data storage media is constructed with a thermal retention structure tuned with respect to an underlying substrate. As shown, a brief initial application of heat, illustrated by region 206, brings the substrate to an elevated temperature. With a predetermined temperature threshold being met during or after the application of heat, the external thermal source is removed and the substrate maintains the elevated temperature for a predetermined period of time 208 that corresponds with the tuning of the thermal retention structure.

Eventually, the substrate cools, but the ability to maintain an elevated temperature with such a brief application of heat allows for more efficient media fabrication as temperature monitoring and in-situ heat application is eliminated. As can be appreciated, the various tuning capabilities of the thermal retention structure, such as thickness and material, can allow for the precise control of the timed regions 206 and 208 that can be adjusted to accommodate the fabrication of numerous different magnetic layers that correspond to high substrate temperatures, such as high in-plane anisotropy layers.

Figure 7:
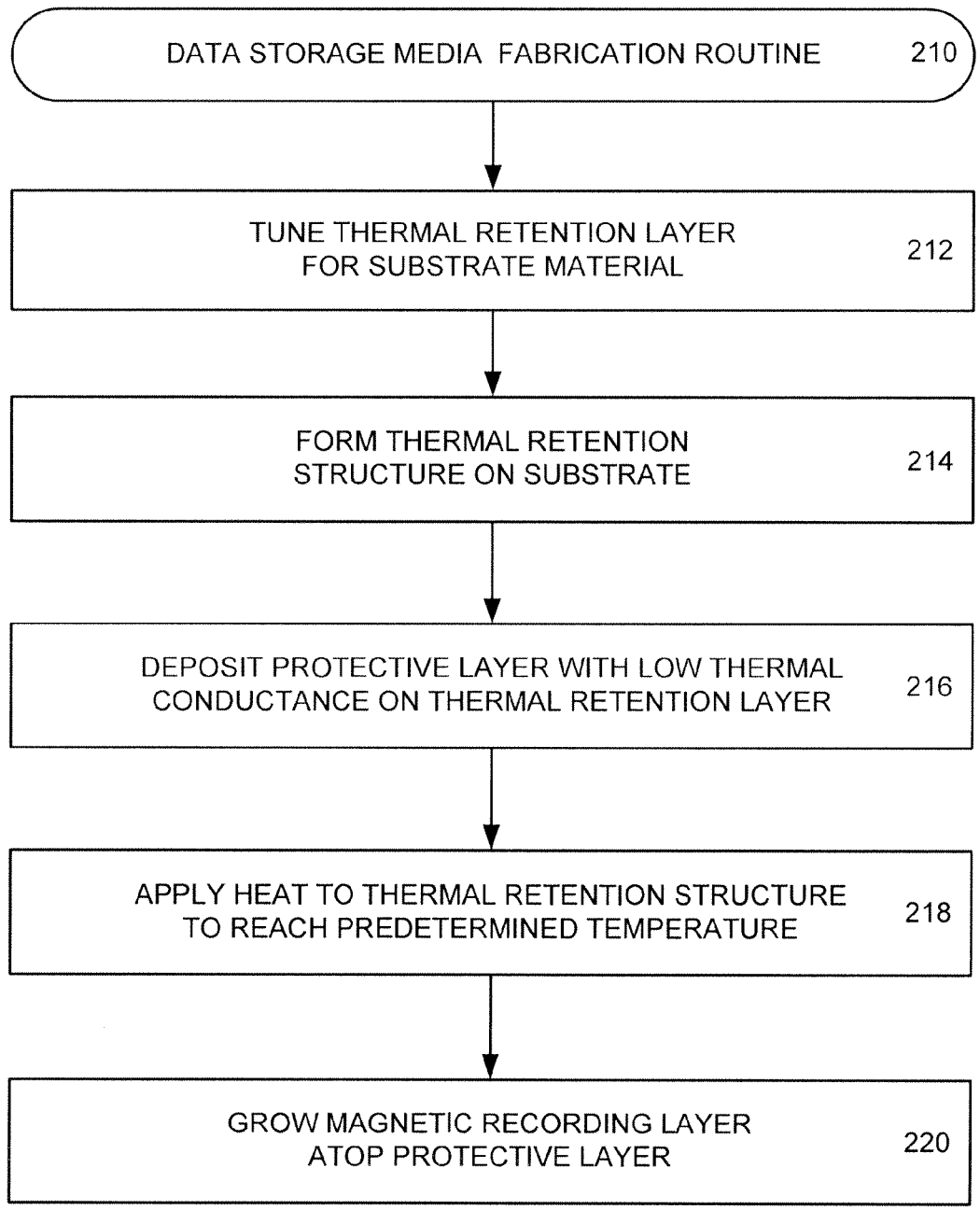
FIG. 7 provides a flowchart of an example magnetic lamination fabrication routine illustrative of steps carried out in accordance with various embodiments.

FIG. 7 provides a flow chart for an example data storage media formatting routine 210 performed in accordance with various embodiments. The routine 210 may begin with any number of design decisions and steps that evaluate the purpose and structure of the data storage media to determine various media characteristics, such as magnetic anisotropy, substrate material, and thermal retention structure configuration.

With at least substrate material, temperature, and heat retention time being determined, step 212 can tune the thermal retention structure to the substrate material. Step 214 subsequently forms the thermal retention structure on the substrate. The thermal retention layer formed in step 214 may have one or many layers with common or dissimilar thicknesses and materials, as displayed in FIGS. 3 and 4, to allow the substrate to retain the predetermined temperature without continuous application of heat during formation of a magnetic recording layer.

Next, step 216 deposits a protective layer with low thermal conductance onto the thermal retention layer. The protective layer may be constructed to provide a blanket effect, of sorts, to contain heat emitted from the thermal retention layer to the substrate. Regardless of the purpose or configuration of the protective layer, step 218 successively applies heat to the data storage media, including at least the thermal retention structure and substrate. The heat can be provided in any number of different manners that elevate the temperature of the substrate to the predetermined temperature, as generally illustrated by region 202 in FIG. 6. In some embodiments, the thermal retention structure is elevated to the predetermined temperature and continuously emits heat to maintain the predetermined temperature in the substrate after the external heat source is removed.

While the substrate is heated to the predetermined temperature, step 220 deposits and grows a magnetic recording layer atop the protective layer. As discussed above, the continued elevated temperature of the substrate can allow for high in-plane anisotropic magnetic layers to be formed in step 220. However, not all layers of the magnetic recording layer must be deposited while the substrate is above the predetermined temperature. That is, some magnetic recording sub-layers may be formed while the substrate is below the predetermined temperature, depending on the chosen design and purpose of the data storage media.

The various steps of routine 210 can provide a data storage media tuned with respect to structural and operational characteristics. However, the routine 210 is not limited to the steps provided in FIG. 7. That is, the various aspects of the routine 210 can be altered, moved, and omitted without deterring from the spirit of the present disclosure. Furthermore, any number of steps and decisions can be added to the routine 210 to more succinctly provide the manner in which a data storage media can be made and used.

It is particularly noted that the various embodiments illustrated in the present disclosure can provide data storage media capable of retaining heat and provide a substrate temperature conducive to growing high magnetic anisotropic layers capable of increasing data bit density. Moreover, the ability to tune the thermal retention structure to maintain a predetermined substrate temperature over time allows efficient media production as external heat can quickly be applied and removed without having to provide continued application and monitor substrate temperature. It will be appreciated that the various embodiments discussed herein have numerous potential applications and are not limited to a certain field of electronic media or type of data storage devices.

It is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
    tuning a thermal retention structure with an emissivity layer comprising a Cu or Mo material, the thermal retention structure contacting a substrate;
    heating the substrate to a temperature range of 400-800° C.;
    maintaining the substrate within the temperature range for between 3 ps-60 s without continuous application of heat to the substrate; and
    growing a magnetic layer of a crystalline material on the thermal retention structure, the magnetic layer having an in-plane magnetic anisotropy while the substrate is maintained at the temperature range continuously.

2. The method of claim 1, wherein the substrate and thermal retention structure are heated, the heat inducing the temperature range before the heat is removed and the magnetic layer is grown.

3. The method of claim 1, further comprising annealing the magnetic recording layer with the application of laser radiation.

4. The method of claim 1, wherein the temperature range is maintained for over 10 seconds.

5. The method of claim 1, wherein the magnetic layer is accessed by heat assisted magnetic recording with a thermal saturation profile.

* * * * *

UNITED STATES PATENT AND TRADEMARK OFFICE
CERTIFICATE OF CORRECTION

PATENT NO. : 9,263,077 B2
APPLICATION NO. : 13/442526
DATED : February 16, 2016
INVENTOR(S) : Yukiko Kubota It is certified that error appears in the above-identified patent and that said Letters Patent is hereby corrected as shown below:

In the Title Page:

Add item (71) Applicant:
"Seagate Technology LLC, Cupertino, CA (US)"

In the Title Page:

Change item (76) to read item (75)

In the Title Page:

Add item (73) Assignee:
"Seagate Technology LLC, Cupertino, CA (US)"

Signed and Sealed this
Twenty-third Day of August, 2016

Michelle K. Lee
*Director of the United States Patent and Trademark Office*